United States Patent

[11] 3,628,059

[72] Inventor George G. Y. Niu
Sunnyvale, Calif.
[21] Appl. No. 41,963
[22] Filed June 1, 1970
[45] Patented Dec. 14, 1971
[73] Assignee Fairchild Camera and Instruments Corporation
Mountain View, Calif.

[54] HIGH VOLTAGE FUNCTIONAL COMPARATOR
8 Claims, 5 Drawing Figs.

[52] U.S. Cl. .......... 307/235, 328/14 b, 330/30 D
[51] Int. Cl. .......... H03k 5/20
[50] Field of Search .......... 307/235; 328/146, 147; 330/30 D

[56] References Cited
UNITED STATES PATENTS

| | | | |
|---|---|---|---|
| 3,416,004 | 12/1968 | Taylor .......... | 307/235 |
| 3,166,678 | 1/1965 | Fleshman, Jr. et al. .......... | 307/235 |

*Primary Examiner*—John Zazworsky
*Attorneys*—Roger S. Borovoy, Alan MacPherson and Charles L. Botsford

ABSTRACT: A comparator circuit has an hysteresis relationship between its two-level output signal and the input signal. As a result, the level of the output signal is substantially independent of noise on the input signal. By changing the value of a resistor the amount of hysteresis in the circuit is changed.

INVENTOR.
GEORGE G.Y. NIU
BY Alan H. MacPherson
ATTORNEY

INVENTOR.
GEORGE G.Y. NIU
BY Alan H. MacPherson
ATTORNEY

HIGH VOLTAGE FUNCTIONAL COMPARATOR

BACKGROUND OF THE INVENTION

1. Field of the Invention

This invention relates to circuits capable of producing an output signal which adopts one of two discrete levels in response to an input signal which can vary within a range of levels.

2. Description of the Prior Art

A comparator is used to provide an output signal the level of which indicates whether the level of an input signal is above or below a given value. In determining the value held by the input signal, noise on the input signal must not be allowed to affect the value of the output signal. Thus, if the input signal is particularly near the threshold level which divides a low-level output signal from a high-level output signal, there is a distinct possibility that the output signal value indicated by the circuit will be wrong due to this noise.

SUMMARY OF THE INVENTION

The circuit of this invention substantially overcomes this problem of the prior art by providing a circuit with an hysteresis relationship between the output signal and the input signal. Thus, noise on the input signal fails to switch the level of the output signal, provided the noise is less than a preselected value. An easily-changed resistor controls the amount of hysteresis which must be overcome to switch the output signal from one to the other level.

According to this invention, a comparator circuit comprises an input stage with a high input-impedance and a low input bias current and an output stage which provides an interface for the output signal levels from this circuit to circuits utilizing the output signals, such as DTL or TTL logic circuits. A two-state current source is provided, the current source being either off or on, depending upon the relationship of the level of the input signal to the level of a reference signal derived from a reference source. A second current source is connected between a voltage supply and the first current source. The reference source is connected by an hysteresis resistor to the node between the first and second current sources.

When the input voltage is less than the reference voltage by a selected amount, the first current source is off. Then the current from the second current source flows through the hysteresis resistor to the reference source. The output signal, taken from the output stage, is high level.

When the input signal rises above the reference potential by the voltage drop across the hysteresis resistor, the first current source turns on and draws twice the current produced by the second current source. The second current source supplies half of this current. To supply the other half of this current, a current flows through the hysteresis resistor from the reference source. In response thereto, the output signal level drops from high to low.

The difference between the input voltage and the reference potential necessary to switch the output signal from high to low or from low to high is just the voltage drop across the hysteresis resistor. By changing the value of the hysteresis resistor the value of this hysteresis voltage is changed.

Integrated-hybrid circuit techniques are particularly applicable to the circuit of this invention allowing the circuit to be miniaturized. Miniaturization allows the circuit to be mounted close to the signal source being monitored, thus reducing the capacitance of the leads connecting this signal source to the hysteresis circuit. Short lead lengths also reduce noise. Because the circuit can be built using integrated-hybrid circuit techniques, its cost is low, thus allowing large numbers of this circuit to be used in complex testing systems suitable for use with Large Scale Integration (usually referred to as LSI). Such testing is essential to ensure that the complex integrated circuits perform as expected. Moreover, when built in integrated-hybrid form, this circuit has fast response time, thus making possible high-speed testing of LSI circuits. With a perfectly balanced input stage containing an extremely high input resistance, a high common mode rejection ratio (CMRR), and an extremely high common mode voltage range is obtained.

DETAILED DESCRIPTION

Figure 1:
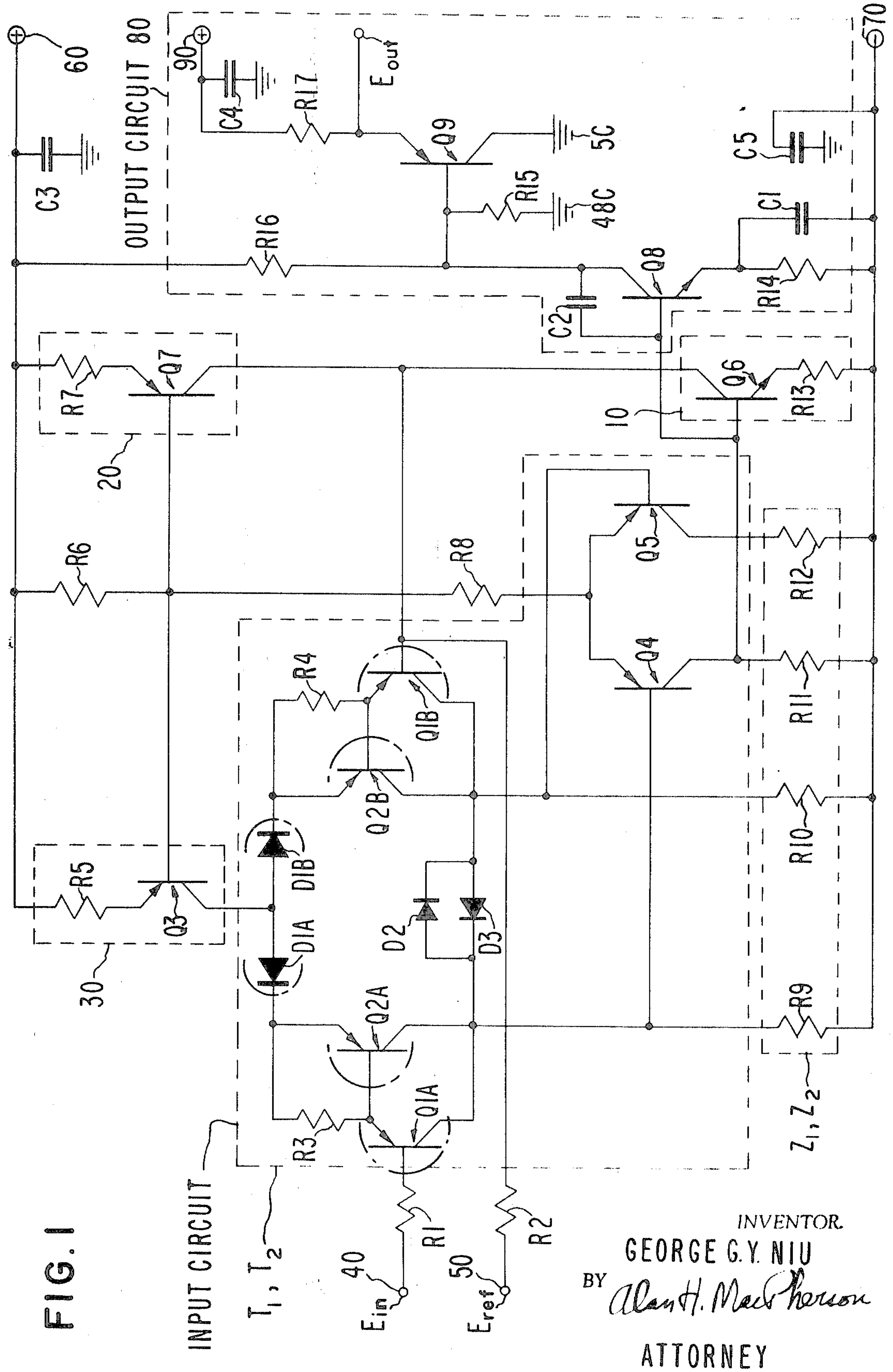
FIG. 1 shows the circuit schematic of the hysteresis circuit of this invention.

FIG. 1 shows the diagram of a circuit using the principles of this invention. The various components of FIG. 1 enclosed in dashed boxes correspond to the equivalently labeled components shown in FIG. 2. The dashed half-circles around adjacent components such as diodes D1A and D1B or transistors Q1A and Q1B indicate that these components are formed as matched pairs and are mounted in the same package in the discrete version of this circuit.

An input signal applied to the base of PNP-transistor Q1*a* (FIG. 1) through resistor R1 controls the level of the output signal derived from the collector lead of PNP-transistor Q4. Resistors R1 and R2 are equal and balance the input stage for high common mode rejection. Transistors Q1A, Q1B, Q2A and Q2B form matched Darlington pairs for the input stage. An input signal $E_{in}$ from source 40, applied to the base of Q1A through resistor R1 controls the state of transistors Q1A, Q2A, Q1B and Q2B. When $E_{in}$ is a selected amount below a reference signal $E_{ref}$ from source 50, the base-emitter junction of transistor Q1A is forward-biased and turns on. Emitter current through resistor R3 drives the base voltage of PNP-transistor Q2A sufficiently below its emitter voltage to turn on transistor Q2A. Current from current source 30, comprising PNP-transistor Q3 with resistor R5 interconnecting Q3's emitter to positive voltage source 60, supplies collector currents to transistors Q1A and Q2A through diode D1A. Positive voltage source 60 in one embodiment supplied +48 volts. Of course, other voltages can be used with appropriate changes in the component values.

Diodes D1A and D1B prevent reverse breakdown in the first stage and are needed to prevent high input voltages (say ±30 volts) from damaging transistors Q1A, Q2A, Q1B and Q2B.

The collector currents of transistors Q1A and Q2A pass through resistor R9 to negative voltage source 70 which, in one embodiment, is −48 volts. The voltage drop across resistor R9 biases off transistor Q4. Consequently, the collector voltage on transistor Q4 drops to approximately the voltage of negative voltage source 70. Q4's low-level collector voltage biases off transistor Q6. Q4's low-level collector voltage is also transmitted to output circuit 80 there turning off NPN-transistor Q8. The high collector voltage on transistor Q8 biases off PNP-transistor Q9. Transistor Q9's emitter voltage, determined by the voltage drop across resistor R17, remains high-level and constitutes the output signal from the circuit. Output circuit 80 adjusts the level of the output signal to be compatible with the input signal levels required to drive the circuit which uses this signal. By varying the magnitude of voltage source 90, the level of the output signal from the emitter of transistor Q9 is varied as desired.

When transistors Q1A and Q2A are on and conducting the current supplied by current source 30, current not only flows through resistor R9, but, because of diode D2, also through resistor R10. Diode D2, however, ensures that the voltage across resistor R9 is above the voltage across resistor R10 by at least the forward bias voltage of a PN-junction before current flows through resistor R10. The current through resistor R10 is not enough to turn off transistor Q5. However, transistor Q5 is prevented from becoming saturated and transistor Q4 is held just beneath its turn-on condition by the presence of diode D2. Likewise, when transistor Q4 is conducting current, transistor Q5 is held in the nonconducting state by diode D3, connected in parallel with, but oppositely poled to, diode D2. Essentially, diodes D2 and D3 make possible very rapid switching of transistors Q4 and Q5 from on to off and vice versa by preventing either Q4 or Q5 from saturating when on.

Transistor Q7 is connected in a manner similar to transistor Q3. Resistor R7, which together with Q7 comprise current source 20, connects Q7's emitter to positive voltage source 60. Resistors R6 and R8 bias the base of transistor Q7 as they do the base of transistor Q3, such that transistor Q7 is on, conducting the current $I_1$ (see FIG. 2). Transistor Q6 together with resistor R13 comprises two-state current source 10. Current source 10 can be either on or off. When source 10 is off, the current $I_1$ must flow through resistor R2 to the source 50 of reference voltage $E_{ref}$. In passing through resistor R2, current $I_1$ creates a voltage drop across this resistor equal to $I_1R2$. Thus the voltage on the base of PNP-transistor Q1B is held above $E_{ref}$ by the amount $I_1R2$. This high voltage holds transistors Q1B and Q2B off.

Figure 2:
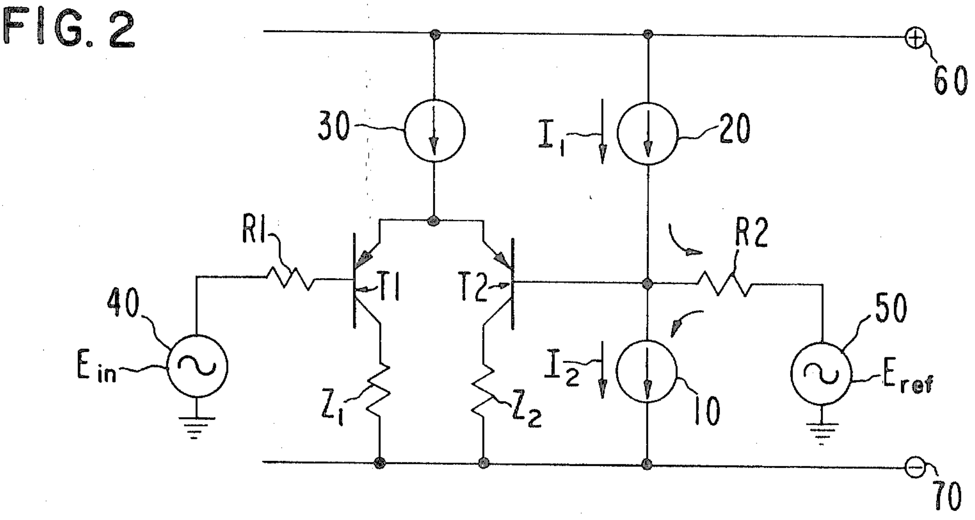
FIG. 2 shows the equivalent circuit of FIG. 1 for producing the hysteresis loop.
Figure 3:
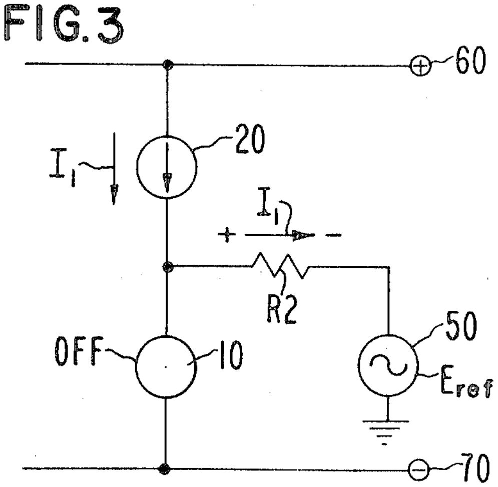
FIG. 3 shows the current flow through the equivalent circuit of FIG. 2 during the production of a high-level positive output signal from the circuit of FIG. 1.

The current flow $I_1$ from current source 20 through resistor R2 to reference source 50 is shown in both FIGS. 2 and 3. No current flows through current source 10 because transistor Q6 is off. FIG. 3 illustrates the current flow from the reference source 50 to the current source 10 through the circuit of FIG. 2 for the voltage $E_{in}$ from source 40 beneath $E_{ref}$.

Figure 5:
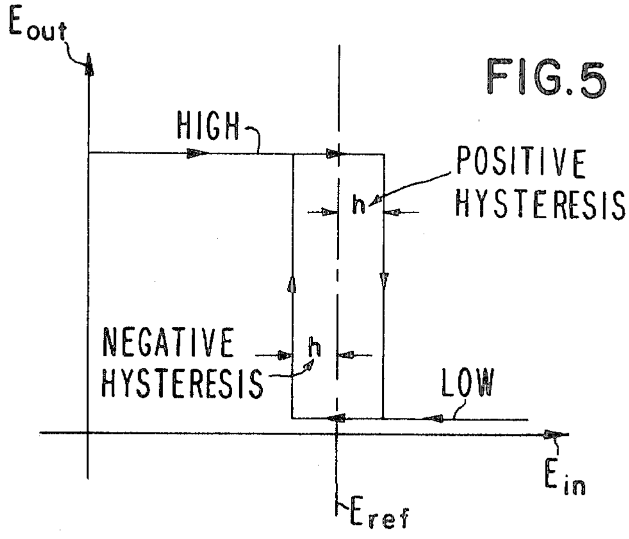
FIG. 5 shows the hysteresis relationship between the output signal $E_{out}$ from the circuit of FIGS. 1 and 2 and the input signal $E_{in}$ to this circuit.

FIG. 5 shows that the circuit output voltage $E_{out}$ is high, for $E_{in}$ beneath $E_{ref}$ by at least the hysteresis value "*h*" and that the circuit output voltage is low for $E_{in}$ above $E_{ref}$ by at least the hysteresis value "*h*."

As the voltage $E_{in}$ from source 40 increases and becomes larger than the voltage $E_{ref}$ from reference source 50, the collector voltage on transistor $Q_4$ remains low so long as transistor Q2A continues to conduct the current from current source 30. As $E_{in}$ continues to increase, eventually a level is reached at which the base voltage of transistor Q1A becomes sufficiently high to back-bias the base-emitter junctions of transistors Q1A and Q2A. At this time, the current supplied by current source 30 no longer can pass through transistors Q1A and Q2A and instead is shunted through diode D1B to transistors Q1B and Q2B. The high collector voltage on transistor Q3 forward biases the base-emitter junction of transistors Q1B and Q2B, the base voltages of which are held at approximately $E_{ref}+R_2I_1$ while Q1B and Q2B are off. It should be noted here that as $E_{in}$ is increased above $E_{ref}$, transistors Q1A and Q2A, together with transistors Q1B and Q2B, are gradually forced into their linear range of operation. Because diodes D2 and D3 allow some current through resistors R9 and R10 at all times, transistor Q4, though off when $E_{in}$ is less than $E_{ref}$ by a given amount, gradually turns on and Q5, which is normally on when $E_{in}$ is less than $E_{ref}$, gradually turns off. As transistor Q4 gradually turns on, its collector voltage gradually rises due to its collector current flowing through resistor R11. This gradual rise in Q4's collector current gradually turns on transistor Q6. Thus transistor Q6 is able to draw some of the current produced by current source 20. Consequently the base voltages of transistors Q1B and Q2B gradually drop, turning on transistors Q1B and Q2B. As these two transistors turn on, they too enter their linear range of operation. Thus the gradual transfer of the current from current source 20, from passage through resistor R2 to current source 10, results in the gradual lowering of the base voltages on transistors Q1B and Q2B simultaneously with the gradual rise in base voltages on transistors Q1A and Q2A. The differential action of transistors Q1B and Q2B in relation to transistors Q1A and Q2A results in transistors Q1A and Q2A shutting off for a lower value of input voltage $E_{in}$ than would normally be expected. Indeed, due to the differential action, the current from current source 30 switches from passing through transistors Q1A and Q2A to transistors Q1B and Q2B when the base voltage on transistors Q1B and Q2B is just $E_{ref}+(I_A{}^{R}{}_{2})/2$. At this instant, transistors Q1B and Q2B conduct all the current from current source 30. Transistor Q4, formerly held off by the high collector voltages of transistors Q1A and Q2A, is now on while transistor Q5, formerly held on by the low collector voltages of transistors Q1B and Q2B is now off in response to the high collector voltage on these transistors created by the voltage drop across resistor R10.

Figure 4:
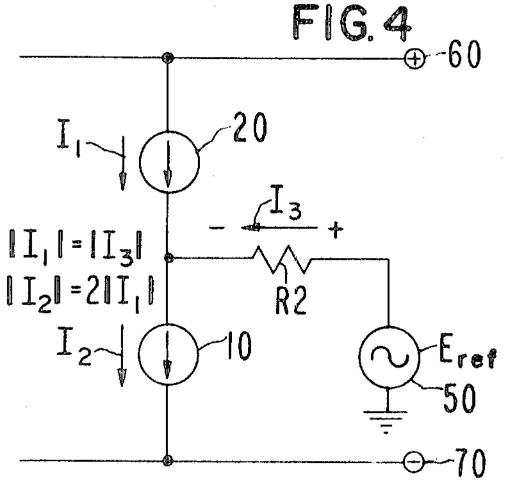
FIG. 4 shows the current flow through the circuit of FIG. 2 during the production of a low-level output signal, i.e., during negative hysteresis.

The collector current through transistor Q4 creates a voltage drop across resistor R11 between the collector of Q4 and negative voltage source 70. This positive voltage drop turns on transistor Q6 which draws the current $I_2$ (see FIG. 2 and FIG. 4). The current $I_2$ is twice the current $I_1$ drawn by current source 20. Consequently, current source 10 draws not only the current $I_1$ produced by current source 20 but also draws through resistor R2 an additional current $I_1$ from reference source 50. Thus, the voltage on the base of transistor Q1B becomes $E_{ref}-R_2I_1$.

The high base voltage on transistor Q6 turns on NPN-transistor Q8 which now draws collector current from positive voltage source 60 through resistor R16. The drop in collector voltage on Q8 turns on PNP-transistor Q9. Q9's emitter current is drawn from a positive voltage source 90 through emitter resistor R17. The drop in voltage across emitter resistor R17 results in the output voltage from output circuit 80 going low. By controlling the magnitude of voltage source 90, the signal levels corresponding to high and low level output signals from output circuit 80 can be appropriately controlled.

Capacitor C1 is added to broadband the response of transistor Q8 resulting in a faster switching time. In addition, capacitor C1 forms a lead network with resistor R14 to give more stability to the circuit at high frequency. Capacitor C2 decreases the "under-damped" overshoot on the output signal from transistor Q8. Capacitors C3, C4 and C5 are decoupling capacitors providing a bypass for r.f. signals.

FIG. 5 shows that when the level of $E_{in}$ rises above $E_{ref}$ by the amount *h*, the output signal from the circuit switches from high-level to low-level.

As the level of $E_{in}$ drops below $(E_{ref}+h)$, transistors Q1B and Q2B continue to conduct the current from current source 30 and thus transistor Q6 remains on, conducting not only the current from current source 20 but also the current from reference source 50. Thus the output signal from output circuit 80 remains low-level until $E_{in}$ drops below $(E_{ref}-h)$. *h* just equals $(I_1R2)/2$. Thus, changing the value of R2 changes the amount of hysteresis present in the circuit. Conveniently, in one embodiment R2 is external to the integrated-hybrid circuit portion of the circuit and thus easily changeable.

When $E_{in}$ drops beneath $E_{ref}-(I_1R2)/2$, the base-emitter junctions of transistors Q1A and Q2A again become forward-biased. When transistors Q1A and Q2A turn on, they draw the current supplied by current source 30. Diode D1B now becomes back-biased and D1A becomes forward biased. The collector currents through transistors Q1A and Q2A now again create a voltage drop across resistor R9 that turns off transistor Q4. The elimination of the collector current through transistors Q1B and Q2B results in a drop in the collector voltages of transistors Q1B and Q2B which turn on transistor Q5. The turning off of transistor Q4 turns off transistor Q6. Thus, the current $I_1$ from current source 20 is again forced through resistor R2 to reference source 50.

It is apparent from the above description that the described circuit exhibits an hysteresis relationship between the two-valued output signal taken from the emitter of transistor Q9 and the input signal, which is allowed to vary over a side range of values. For any given value of output signal, the system is impervious to noise with an amplitude less than *h*. By varying the value of resistor R2, the sensitivity of the system to noise can be changed.

The high input impedances of transistors Q1A and Q1B result in extremely low input currents to the circuit. The transistors Q1A, Q1B, Q2A and Q2B form matched Darlington pairs and thus are very closely balanced. For a wide range of input signals $E_{in}$, the input circuit remains balanced and thus possesses a high common mode rejection ratio.

The circuit can economically be produced in integrated-hybrid circuit form. The hysteresis loop characteristics are externally adjustable by changing resistor R2. The circuit does not need constant calibration. Its small size makes it possible to place it close to the source of the input signal $E_{in}$ thereby reducing input lead capacitance. Its common mode rejection ratio remains high due to the balanced input stage together with the high impedance current source 30 (FIG. 1). Its small size, together with small lead-lengths, reduces its response time making it a high-speed circuit. The hysteresis circuit disclosed is ideal for use with the voltage levels used to test MOS devices or with the voltage levels used in high-voltage logic systems.

A circuit built with discrete components according to this invention used the following component values:

| | |
|---|---|
| Q1A—2N4017 | D1A—FA2320E |
| Q1B—2N4017 | D1B— |
| Q2A—2N4017 | D2—FD100 |
| Q2B—2N4017 | D3— |
| Q3—2N4249 | |
| Q4—2N4121 | |
| Q5—2N 4121 | |
| Q6—2N3114 | C1—500 pF |
| Q7—2N4249 | C2— 5 pF |
| Q8—2N2484 | C3—0.1, 50 v. |
| Q9—2N4209 | C4—0.1, 10 v. |
| | C5—0.1, 50 v. |
| R1—270 ohm | |
| R2—270 ohm | |
| R3—51 kΩ | |
| R4—51 kΩ | |
| R5—4.7 kΩ, 1% | |
| R6—10 kΩ, 1% | |
| R7—750 kΩ | |
| R8—75 kΩ | |
| R9—10 kΩ, 1% | |
| R10—10 kΩ, 1% | |
| R11—4.7 kΩ | |
| R12—4.7 kΩ | |
| R13—150 kΩ | |
| R14—1.8 kΩ | |
| R15—3.3 kΩ | |
| R16—27 kΩ | |
| R17—2 kΩ | |

Other embodiments of this invention will be obvious in view of this disclosure. For example, an embodiment wherein the current drawn by two-state current source 10 is other than twice the current supplied by constant current source 20 thereby yielding an asymmetric hysteresis loop will be apparent in view of this disclosure.

I claim:

1. Structure which comprises a two-state current source capable of either drawing the current $I_2$ or drawing any current, said two-state current source possessing an input lead;

a first current source which supplies a current $I_1$, said first current source possessing an output lead which is connected to the input lead of said two-state current source;

a source of reference potential connected through a hysteresis resistor to the output lead of said first current source and the input lead of said two-state current source; and means for switching said two-state current source either on or off, in response to an input signal going selected amounts above or below, respectively, said reference potential, said two-state current source not drawing any current when said input signal goes to one side of said reference potential by a first selected amount, thereby forcing the current $I_1$ through said source of reference potential, said two-state current source drawing the current $I_2$ when said input signal goes to the other side of said reference potential by a second selected amount thereby allowing said two-state current source to draw the current from said first current source plus an additional current from said source of reference potential.

2. Structure as in claim 1 wherein said one side is beneath said reference potential and said other side is above said reference potential.

3. Structure as in claim 1 wherein said two-state current source when on draws the current $I_2$, where $I_2$ equals $2I_1$.

4. Structure as in claim 1 wherein said source of reference potential supplies the current $I_1$ to said two-state current source when said two-state current source draws the current $I_2$.

5. Structure as in claim 2 wherein said first and second selected amounts equal one-half $I_1$ times the hysteresis resistor connecting said reference potential to the output of said first current source and the input of said two-state current source.

6. Structure as in claim 5 wherein said means for switching said two-state current source comprises an input circuit, said input circuit comprising:

a second current source supplying a given current; and a first and a second pair of matched transistors, each pair comprising a first and a second transistor, the emitters of the transistors in said first pair being coupled to said second current source, the base of the first transistor in said first pair being connected to the source of said input signal and the base of said second transistor in said first pair being connected to said source of reference potential, the emitters of said transistors in said second pair being coupled to said second current source, the bases of said first and second transistors in said second pair being connected to the emitters of said first and second transistors respectively in said first pair, and the collectors of the first transistors in said first and second pairs being connected through a first resistor to a source of potential, the collectors of the second transistors in said first and second pairs being connected through a second resistor to said source of potential.

7. Structure as in claim 6 wherein:

the emitters of the first and second transistors in said first pair are coupled by first and second resistors to said second current source;

the base of the first transistor in said first pair is connected by a third resistor to said source of said input signal;

the base of the second transistor in said first pair is connected by the hysteresis resistor to said source of reference potential; and the collectors of the first transistors in said first and second pairs are connected to the collectors of the second transistors in said first and second pairs by two diodes, oppositely poled in parallel.

8. Structure which comprises:

means for generating a reference potential $E_{ref}$;

means for producing a first constant current $I_0$;

means, responsive to an input signal $E_{in}$, for shunting said first constant current, $I_0$, through a first path or a second path;

means for producing a second constant current $I_1$; and two-state means, responsive to the path traveled by said first constant current $I_0$, for drawing either a current $2I_1$ or no current, said means for generating a reference potential drawing through a hysteresis resistor the current $I_1$ from said means for producing a second constant current $I_1$ and said two-state means drawing no current when said input signal $E_{in}$ goes to less than $E_{ref}$ by a first given amount, and said two-state means drawing the current $2I_1$ when said input signal $E_{in}$ goes above $E_{ref}$ by a second selected amount, said second constant current source supplying the current $I_1$ to said two-state means and said reference source supplying through said hysteresis resistor the remaining current $I_1$.

* * * * *

UNITED STATES PATENT OFFICE
CERTIFICATE OF CORRECTION

Patent No. 3,628,059 Dated December 14, 1971

Inventor(s) George G. Y. Niu

It is certified that error appears in the above-identified patent and that said Letters Patent are hereby corrected as shown below:

Column 5, line 55, between "or" and "drawing" should read -- not --. Column 6, line 9, "the" should read -- a --; line 17, between "input" and "of" should read -- lead --.

Signed and sealed this 31st day of October 1972.

(SEAL)
Attest:

EDWARD M.FLETCHER,JR.
Attesting Officer

ROBERT GOTTSCHALK
Commissioner of Patents